US 010879936B2

(12) United States Patent
Campbell

(10) Patent No.: US 10,879,936 B2
(45) Date of Patent: Dec. 29, 2020

(54) METHODS, SYSTEMS, AND COMPUTER READABLE MEDIA FOR DE-INTERLEAVING DATA IN A COMMUNICATION SYSTEM

(71) Applicant: Keysight Technologies, Inc., Santa Rosa, CA (US)

(72) Inventor: Damon Lee Campbell, Oakland, CA (US)

(73) Assignee: KEYSIGHT TECHNOLOGIES, INC., Santa Rosa, CA (US)

(*) Notice: Subject to any disclaimer, the term of this patent is extended or adjusted under 35 U.S.C. 154(b) by 208 days.

(21) Appl. No.: 16/110,887

(22) Filed: Aug. 23, 2018

(65) Prior Publication Data
US 2020/0067535 A1    Feb. 27, 2020

(51) Int. Cl.
*H03M 13/27* (2006.01)
*H04W 72/04* (2009.01)
*H04L 1/00* (2006.01)

(52) U.S. Cl.
CPC ...... *H03M 13/2764* (2013.01); *H04L 1/0071* (2013.01); *H04W 72/042* (2013.01)

(58) Field of Classification Search
None
See application file for complete search history.

(56) References Cited

U.S. PATENT DOCUMENTS

| 4,672,605 A * | 6/1987 | Hustig | H03M 5/12 370/201 |
| 5,063,533 A * | 11/1991 | Erhart | G06F 7/785 711/157 |
| 6,055,277 A * | 4/2000 | Stephens | H03M 13/2742 370/535 |
| 6,526,539 B1 * | 2/2003 | Yano | H03M 13/2792 714/786 |
| 6,567,390 B1 * | 5/2003 | Banister | H04L 1/0045 370/342 |
| 7,954,015 B1 * | 5/2011 | Dhanoa | H03M 13/2703 375/254 |

(Continued)

FOREIGN PATENT DOCUMENTS

WO    WO-2008032261 A2 *    3/2008    ......... H03M 13/271

OTHER PUBLICATIONS

"3rd Generation Partnership Project; Technical Specification Group Radio Access Network; NR; Multiplexing and channel coding (Release 15)", 3GPP TS 38.212, V15.2.0, pp. 1-94 (Jun. 2018).

(Continued)

*Primary Examiner* — Ayaz R Sheikh
*Assistant Examiner* — Tarell A Hampton

(57) ABSTRACT

A system includes a data bus, Q registers each having a register width B, and a receiver circuit. The receiver circuit is configured for receiving, at each clock cycle of a number of clock cycles of the communication system, a bit lane of data on a data bus, each bit lane including Q valid bits of an interleaved packet of length E. The receiver circuit is configured for placing, at each clock cycle, each of the Q valid bits into a respective bin of Q bins each having a bin width equal to the register width B. The receiver circuit is configured for determining that the bins are full, and in response to determining that the bins are full, transferring the contents of the bins into the registers.

14 Claims, 8 Drawing Sheets

(56) References Cited

U.S. PATENT DOCUMENTS

| | | | |
|---|---|---|---|
| 8,433,976 B1 | 4/2013 | Demirsoy | |
| 8,572,456 B1* | 10/2013 | Pan | H03M 13/2775 |
| | | | 714/755 |
| 2004/0037371 A1* | 2/2004 | Brennan | H03M 13/27 |
| | | | 375/327 |
| 2004/0268207 A1* | 12/2004 | Sharma | H03M 13/6502 |
| | | | 714/763 |
| 2005/0160342 A1* | 7/2005 | Wellig | H04L 1/0071 |
| | | | 714/755 |
| 2006/0259843 A1* | 11/2006 | Welborn | H03M 13/2732 |
| | | | 714/746 |
| 2009/0164748 A1 | 6/2009 | Mansour | |
| 2010/0235721 A1 | 9/2010 | Bukris et al. | |
| 2010/0254493 A1* | 10/2010 | Yang | H03M 13/255 |
| | | | 375/340 |
| 2010/0318878 A1 | 12/2010 | Mansour | |
| 2010/0321586 A1* | 12/2010 | Yang | H04L 27/2647 |
| | | | 348/726 |
| 2011/0004806 A1* | 1/2011 | Adachi | H04L 27/2647 |
| | | | 714/763 |
| 2011/0280185 A1* | 11/2011 | Wu | H03M 13/2775 |
| | | | 370/328 |
| 2013/0051354 A1* | 2/2013 | Ling | H04L 1/005 |
| | | | 370/329 |
| 2013/0155867 A1* | 6/2013 | Asokan | H04W 24/06 |
| | | | 370/241 |
| 2013/0155872 A1 | 6/2013 | Subramanian et al. | |
| 2013/0208600 A1 | 8/2013 | Campbell et al. | |
| 2013/0227233 A1 | 8/2013 | Asokan | |
| 2013/0235727 A1 | 9/2013 | Campbell et al. | |
| 2013/0305001 A1* | 11/2013 | Rijshouwer | H03M 13/276 |
| | | | 711/156 |
| 2015/0140956 A1 | 5/2015 | Prewitt, II et al. | |
| 2015/0326351 A1* | 11/2015 | Kim | H04L 1/0071 |
| | | | 375/219 |
| 2016/0352419 A1* | 12/2016 | Fonseka | H03M 13/2775 |
| 2017/0149452 A1 | 5/2017 | Henker et al. | |
| 2018/0062971 A1 | 3/2018 | Kyosti et al. | |
| 2018/0167829 A1 | 6/2018 | Luo | |

OTHER PUBLICATIONS

"3rd Generation Partnership Project; Technical Specification Group Radio Access Network; NR; Physical channels and modulation (Release 15)", 3GPP TS 38.211, V15.2.0, pp. 1-93 (Jun. 2018).

* cited by examiner

FIG. 4

METHODS, SYSTEMS, AND COMPUTER READABLE MEDIA FOR DE-INTERLEAVING DATA IN A COMMUNICATION SYSTEM

TECHNICAL FIELD

The subject matter described herein relates to de-interleaving data in a communication system. More particularly, the subject matter described herein relates to methods, systems, and computer readable media for de-interleaving data received on a Physical Downlink Shared Channel (PDSCH) of a 5G system.

BACKGROUND

In 5G telecommunications there are multiple downlink "channels" that carry user information between the transmitter (e.g., the gNodeB) and the User Equipment (e.g., a cell phone), which are outlined in the Third Generation Partnership Project (3GPP) 38 series specifications. One such channel is the Physical Downlink Shared Channel (PDSCH), which is the main data baring channel for 5G and is primarily outlined in 3GPP Technical Specification (TS) 38.211, Group Radio Access Network; NR; Physical Channels and Modulation V15.2.0 (June 2018) and 3GPP TS 38.212, Group Radio Access Network; NR; Multiplexing and Channel Coding V15.2.0, the disclosures of which are incorporated herein by reference in their entireties The data that goes through PDSCH is operated on by a multitude of processes.

The encoder process is one of these processes performed at the gNodeB. During the encoder process, the raw data stream is converted to a forward error correcting data stream, which in this case is done by a Low Density Parity Check algorithm. The bit selection interleaver process takes selected bits of the output data stream of the encoder process and interleaves the encoded data into a circular buffer of a given size. A receiver at the UE then de-interleaves the received data stream. In some systems, such as test systems that include multi-UE emulators, the de-interleaving process may require a significant amount of computational resources. For example, test systems based on field programmable gate arrays (FPGAs) may not be able to meet timing requirements by simply reversing the interleaver process on a per bit bases as outlined in the TS for each UE of a large number of emulated UEs.

Accordingly, in light of these difficulties there exists a need for improved methods, systems, and computer readable media for de-interleaving data received on a Physical Downlink Shared Channel (PDSCH) of a 5G system.

SUMMARY

The subject matter described herein includes methods, systems, and computer readable media for de-interleaving data in a communication system. A system includes a data bus, Q registers each having a register width B, and a receiver circuit. The receiver circuit is configured for receiving, at each clock cycle of a number of clock cycles of the communication system, a bit lane of data on a data bus, each bit lane including Q valid bits of an interleaved packet of length E. The receiver circuit is configured for placing, at each clock cycle, each of the Q valid bits into a respective bin of Q bins each having a bin width equal to the register width B. The receiver circuit is configured for determining that the bins are full, and in response to determining that the bins are full, transferring contents of the bins into the registers. The receiver circuit is configured for repeatedly receiving and placing data bits from the bit lanes into the bins and transferring the contents of the bins to the registers until at least E valid bits have been transferred to the registers.

The subject matter described herein can be implemented in software in combination with hardware and/or firmware. For example, the subject matter described herein can be implemented in software executed by a processor. In one exemplary implementation, the subject matter described herein can be implemented using a non-transitory computer readable medium having stored thereon computer executable instructions that when executed by the processor of a computer control the computer to perform steps. Exemplary computer readable media suitable for implementing the subject matter described herein include non-transitory computer-readable media, such as disk memory devices, chip memory devices, programmable logic devices, and application specific integrated circuits. In addition, a computer readable medium that implements the subject matter described herein may be located on a single device or computing platform or may be distributed across multiple devices or computing platforms.

BRIEF DESCRIPTION OF THE DRAWINGS

FIG. 4 is a memory segmentation diagram illustrating a view of data in memory after the data has been moved from the registers.

DETAILED DESCRIPTION

Figure 1:
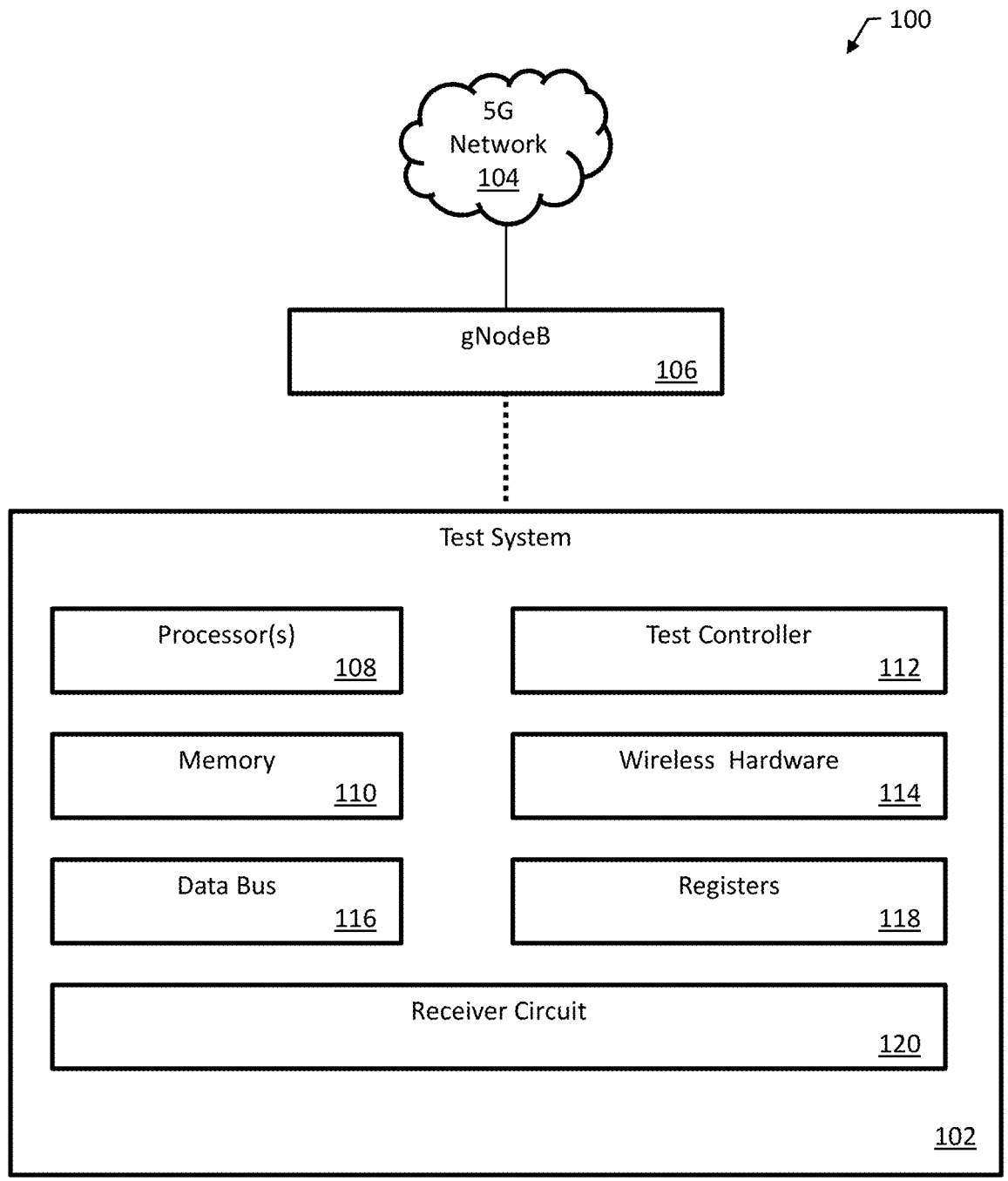
FIG. 1 illustrates an example network testing environment.

The subject matter described herein relates to methods, systems, and computer readable media for de-interleaving data in a communication system. FIG. 1 illustrates an example network testing environment 100 including a test system 102 communicating with a 5G network 104 by way of a wireless connection with a gNodeB 106.

The test system includes one or more processors 108, memory 110, and a test controller 112 implemented on the processors 108 and memory 110. The test system 102 includes wireless hardware 114 for receiving data from the gNodeB 106, e.g., one or more antennas and signal processors. The test controller 112 is configured to execute one or more test scripts to test the 5G network 104 or one or more specific devices associated with the 5G network 104.

For example, the test controller 112 can be programmed for emulating a number of user equipment devices (UEs). The test controller 112 can then receive interleaved data packets from the 5G network 104 for each of the emulated UEs, de-interleave the data packets and perform other receiver signal processing, and compare the received data to expected data. The test controller 112 can generate a test report for the 5G network 104 or specific device of the 5G network 104 based on de-interleaving the received streams of packets for the UEs.

The test system 102 includes a data bus 116 for transferring received packets. The test system 102 also includes a number of registers 118 and a receiver circuit 120 configured for de-interleaving received data packets and optionally for performing other appropriate signal or data processing. For example, the receiving circuit can be implemented on one or more field programmable gate arrays (FPGAs).

The gNodeB 106 uses many processes to process the PDSCH channel of the 5G system. One of these processes is the rate matching bit selection interleaver process to interleave PDSCH packets and transmit the interleaved packets to the test system 102.

Per section 5.4.2.1 of 3GPP TS 38.212 the gNodeB will take the encoded N bits of data denoted as $d_0, d_1, d_2, \ldots, d_{N-1}$ and write them into a circular buffer of size Ncb. This process is mathematically outlined as:

```
k = 0;
j = 0;
while k < E
    if d_(k0+j)modNcb ≠ <NULL>
        e_k = d_(k0+j)modNcb;
        k = k + 1;
    end if
    j = j + 1;
end while
```

Where,
E is the size of the resulting bit sequence
$k_0$ is a given parameter
j is an index into the encoded data stream
k is an index into the rate matched data stream
NULL is a special bit assignment that reflects what is called a punctured bit
$e_k$, k=0,1,2, . . . , E−1 is the rate matching output bit sequence The bit sequence $e_0, e_1, e_2, \ldots, e_{E-1}$ is interleaved to bit sequence $f_0, f_1, f_2, \ldots, f_{E-4}$, according to the following, where the value of $Q_m$ is the modulation order.

```
for j = 0 to E/Q_m − 1
    for i = 0 to Q_m − 1
        f_(i+j·Qm) = e_(i·E/Qm+j);
    end for
end for
```

Figure 2:
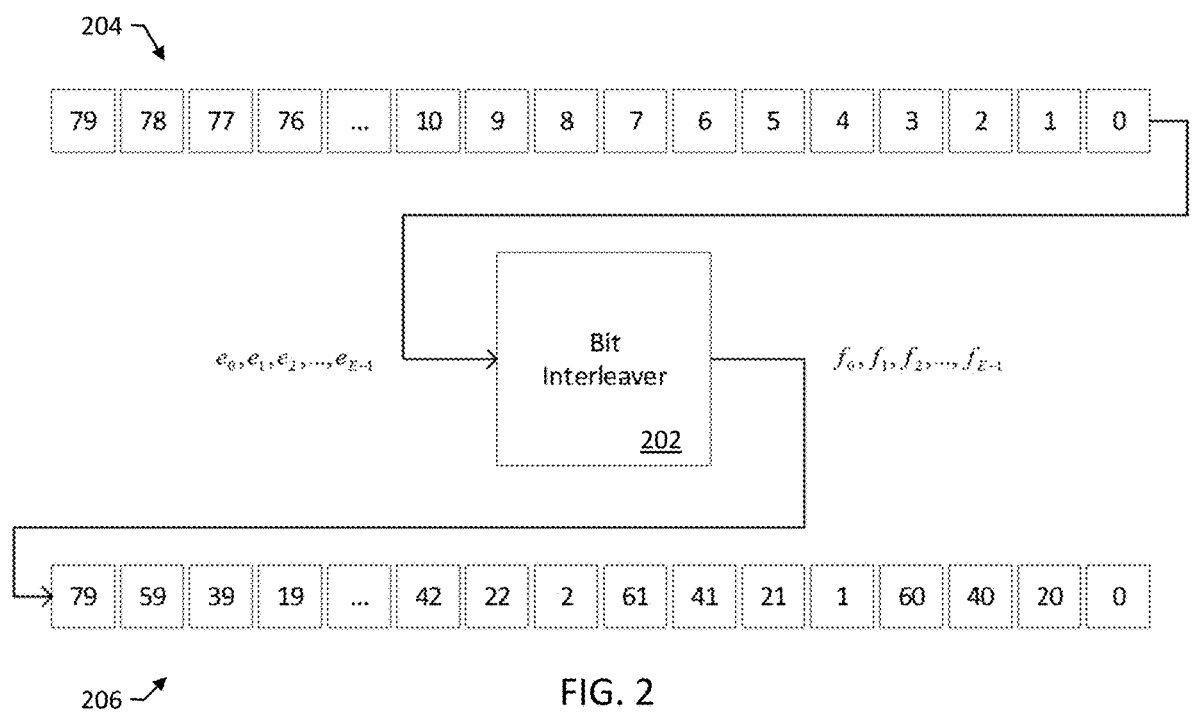
FIG. 2 is a diagram illustrating an example bit interleaver.

FIG. 2 is a diagram illustrating an example bit interleaver 202 using the process as outlined above. The bit interleaver 202 is implemented, e.g., by the gNodeB 106 of FIG. 1. In this example, the bit interleaver 202 uses a $Q_m$ of 4 with a packet length of E=80.

Suppose that the bit interleaver 202 receives as input a first data stream 204 shown at the top of FIG. 2. The data stream 204 is illustrated as a series of blocks, each block having a numerical label indicating the position of the bit index in the first data stream 204. The output of the bit interleaver 202 is a second data stream 206 shown at the bottom of FIG. 2. The second data stream 206 includes the same data as the first data stream 204 in a different order, as indicated by the numerical labels on the bit index.

Referring back to FIG. 1, the receiver circuit 120 is configured for de-interleaving a PDSCH packet of length E, such as the second data stream 206 of FIG. 2. The receiver circuit 120 is configured for receiving, at each clock cycle of a number of clock cycles of the test system 102, a bit lane on the data bus 116. Each bit lane includes Q valid bits of an interleaved packet of length E.

The receiver circuit 120 is configured for placing, at each clock cycle, each of the Q valid bits into a respective bin of Q bins each having a bin width B. The receiver circuit is configured for determining that the bins are full, and in response to determining that the bins are full, transferring the contents of the bins into the registers 118. The test system 102 includes Q registers 118, each of the registers can have a register width equal to the bin width B. In some examples, the bin width and the register width B is equal to the modulation order Q. The receiver circuit 120 is configured for repeatedly receiving and placing bit lanes into the bins and transferring the contents of the bins to the registers 118 until E valid bits have been transferred to the registers 118.

For example, suppose that the receiver circuit 120 receives the number of sample points (i.e., the length E) in the form of E/Q, where Q is a value that specifies the modulation order (e.g., Qm as given in 3GPP TS 38.212). Further suppose that the data bus is 8 bits wide and represents 1 modulation vector and the register/bin width is 16 bits (ie B=16). Then, on every valid clock edge encoded data bit(0) goes to bin(0)(bitIndex), encoded data bit(1) goes to bin(1)(bitIndex) and so forth up to bin(Q-1) with bitIndex being incremented for each valid bit written.

Once a bin contains 16 valid bits (and all bins will do this at the same time) the bins(Q-1:0) are transferred over to 16-bit wide registers Q-1 through 0, which handles the double buffering of data so that while the registers 118 are being written to memory (e.g., of the receiver circuit 120 or the memory 110 of the test system 102) the incoming encoded data is filling the bins back up. In some examples, only the bins that reflect actual modulation data are stored in memory of the receiver circuit.

The receiver circuit 120 is configured to perform the de-interleaving process by virtue of the way memory is segmented and used by the receiver circuit 120. The memory of the receiver circuit 120 can have a static size, e.g., bus width size for input and bus width size for output, and the memory is broken up into Q segments of memory with each segment containing E/Q bits.

Continuing with the example described above, suppose that the memory has a static input/output bus width of 16 bits. An extra memory location or offset per segment can be allocated to handle the case where the E/Q number of bits is not integer devisable by 16. Therefore, there are E/Q/16 plus 1 offsets per segment and the number of valid bits in the last offset of the segment can be reflected by using the last 4 bits of the EDivQ value. More generally, there are E/Q/B plus 1 offsets per segment.

Once all the encoded data has been written, the reading of the data from the memory used by the receiver circuit 120 is done on an incrementing address bases. For example, the receiver circuit 120 can increment a counter to reflect how many bits have been read out of a segment of memory. When this counter reaches the last data of the segment the receiver circuit 120 then uses the last 4 bits of the EDivQ value to reflect at the output of the receiver circuit 120 how many valid bits are present. Therefore, a repeating cycle that happens Q times occurs where there is E/Q/16 transfers of 16 bits of valid data at the output of the IP followed by a single amount of EDivQ[3:0] valid de-interleaved data. Once all Q cycles have completed then the encoded data has been de-interleaved.

By de-interleaving the received data in this manner, the test system 102 can emulate a number of UEs PDSCHs and still meet timing requirements using FPGAs. Meeting timing or other requirements may not be possible in test systems or other receivers based on FPGA hardware when de-interleaving the data by simply reversing the interleaving process as outlined in the 3GPP TS.

Figure 3:
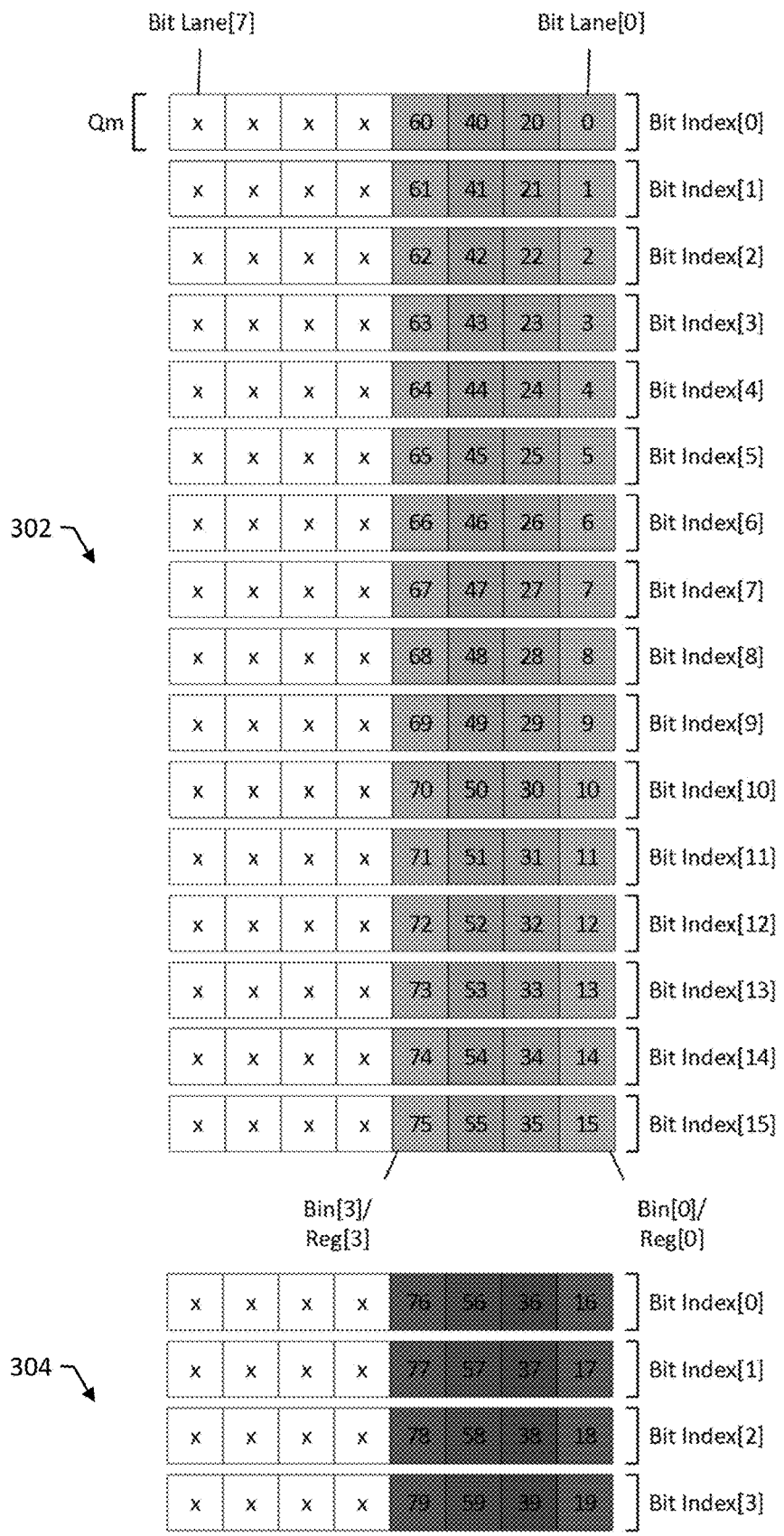
FIG. 3 is a diagram illustrating an example of a number of bins storing received data.
Figure 4:
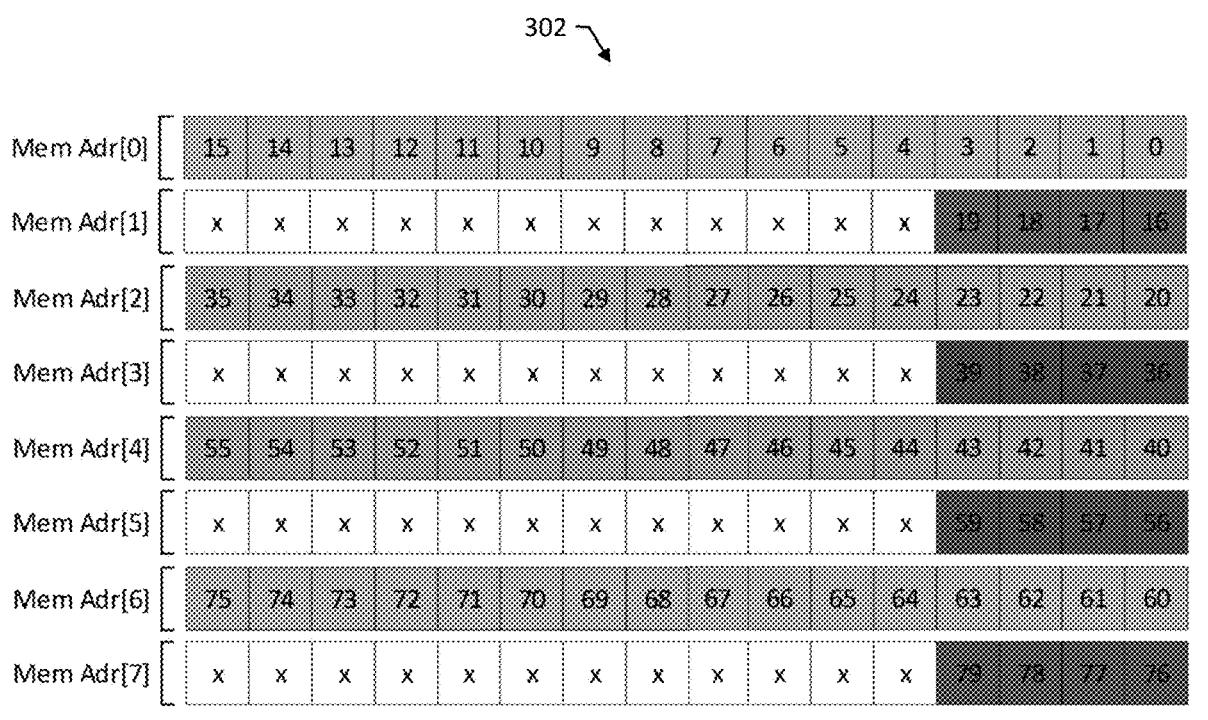

FIGS. 3 and 4 illustrate memory segmentation using the example described above, i.e., where Q=4, the data bus is 8 bits wide, register width of 16 bits and a data packet has a length of 80 bits.

FIG. 3 is a diagram illustrating an example of the number of valid bits on the bus per transfer with each bit location in the bit_lane representing the bit index of the post-interleaved data stream. In this example there are 4 valid bins and each bin can hold 16 bits of data with the bit_index value on the right reflecting where in the bin the given bit is put. The top grid 302 illustrates the Q valid bits from each bit lane as placed into bins. Each row of the top grid 302 represents a bit lane of data received on the data bus, with four bits labelled with the bit position or indices illustrated FIG. 2 and four bits marked with an "x" since the data in those bits is not valid. The rows are labelled from Bit Index[0] to Bit Index[15], so there are 16 total rows or 16 valid bits per bin.

Each column of the top grid 302 represents a bit position in the bit lanes. The columns are labelled from Bit Lane[0] to Bit Lane[7], and the columns containing valid data correspond to Bin[0]-Bin[3]. As shown, there are Q bins (4 bins) and B bits (16 bits) for each bin.

The receiver circuit 120 places the data into the bins by starting at the top (Bit Index[0]) and working towards the bottom (i.e., incrementing to Bit Index[15]). Since a packet has 80 bits in this example, the bins become full when the bins are filled to Bit Index[15], i.e., when bits 75, 55, 35, and 15 are placed into the bins. Then, the contents of the bins are transferred to the registers, and the receiver circuit 120 starts placing newly received data into the bins starting at the top again.

The bottom grid 304 illustrates the placement of the remaining data from the packet. The receiver circuit 120 places the data into the bins until the end of the packet is reached, i.e., when bits 79, 59, 39, and 19 are placed into the bins. Then, the contents of the filled bins are transferred to the registers, and the receiver circuit 120 can begin receiving and de-interleaving a new packet.

FIG. 4 is a memory segmentation diagram illustrating a view of data in memory after the data has been de-interleaved and moved from the registers. The grid 302 shows 8 memory addresses, labelled Mem Adr[0]-Mem Adr[7], each storing 16 bits of data. The bits of data are labelled with the corresponding bit positions or indices illustrated in FIG. 2, and the memory locations marked with an "x" do not store valid data. The de-interleaved packet of data (from data stream 204 of FIG. 2) can now be read from the memory, e.g., as described below with reference to FIG. 7.

Figure 5:
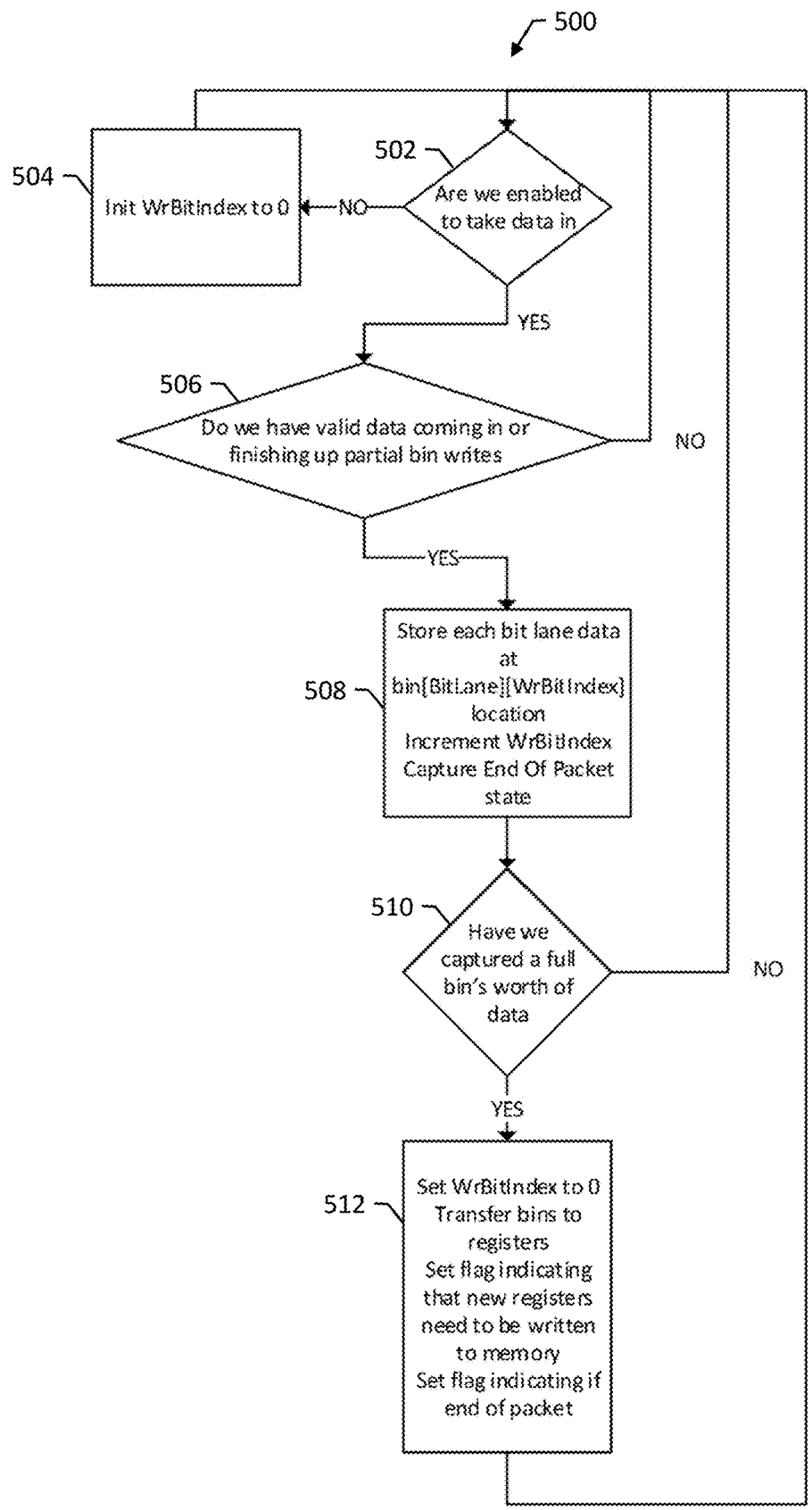
FIG. 5 is a flowchart of an example method for placing valid data received on the data bus into bins and transferring those bins to registers.
Figure 6:
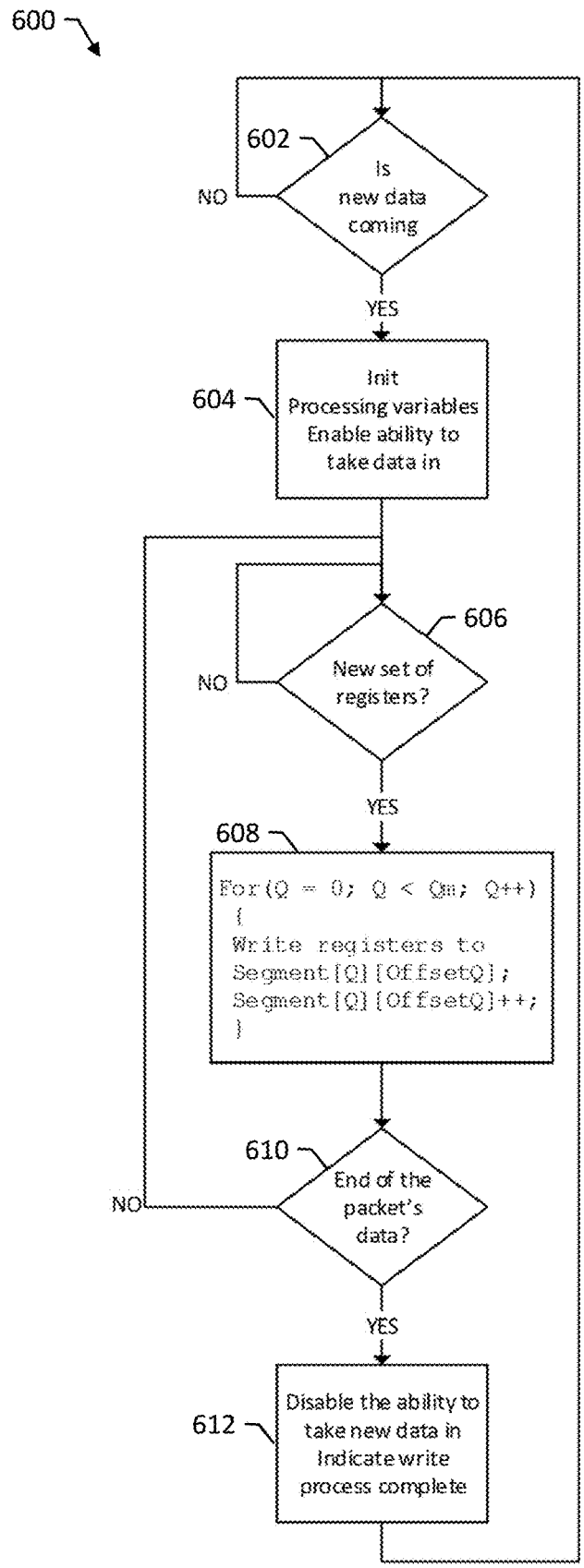
FIG. 6 is a flowchart of an example method for writing the registers to memory.
Figure 7:
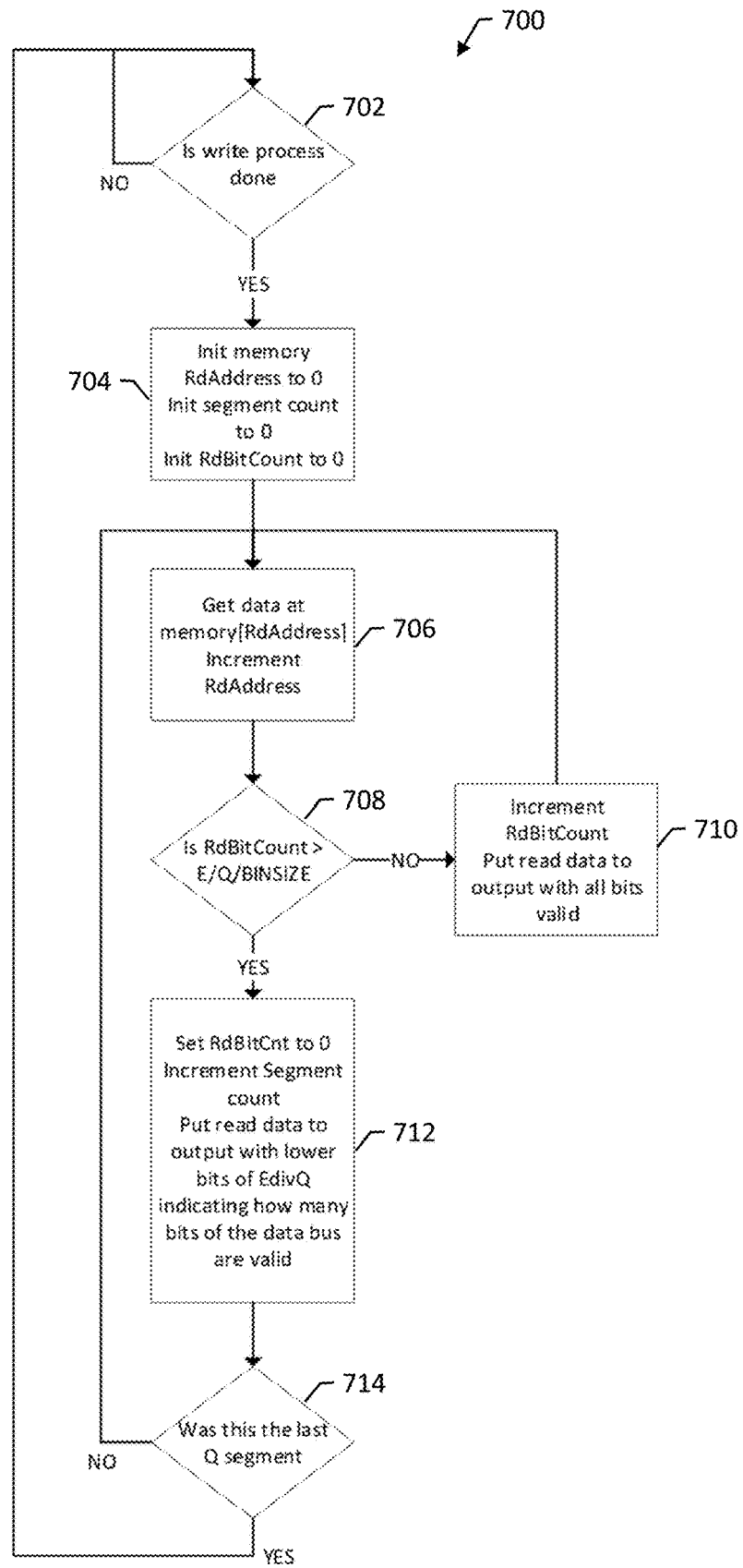
FIG. 7 is a flowchart of an example method for reading data out of memory and indicating which bits of the data bus are valid.

The de-interleaving process can be implemented as three functions—a first function for bringing the valid data into bins and the ability to transfer those bins to registers, a second function for handling how the registers get written to memory, and a third function for reading data out of memory and indicating which bits of the data bus are valid. These functions may be implemented by receiver circuit 120 illustrated in FIG. 1 to de-interleave PDSCH data received from gNode 104. FIGS. 5-7 are flowcharts of example methods to carry out these functions.

FIG. 5 is a flowchart of an example method 500 for placing valid data received on the data bus into bins and transferring those bins to registers. The method 500 can be performed by the receiver circuit 120 of FIG. 1.

The method 500 includes determining whether the circuit is enabled to take data in (502), and if not, initializing the receiver circuit to enable taking data in (504). Initializing the receiver circuit can include setting a bit index to 0 to prepare for writing to bins.

The method 500 includes determining whether valid data is coming in from the data bus or whether the receiver circuit is finishing up partial bin writes (506).

The method 500 includes, if valid data is coming in or the receiver circuit is finishing up partial bin writes, storing each valid bit of a bit lane at an appropriate location in the bins (508). For example, each bit can be stored at bin[BitLane][WrBitIndex]. For each bit, the WrBitIndex value is incremented. The end of packet state is captured if present.

The method 500 includes determining whether a full bin's worth of data has been received (510). If not, the method 500 returns to waiting or receiving data (return to 502). If so, the method includes triggering a write from the registers to memory (512). For example, the WrBitIndex value is set to 0, the bins are transferred to registers, and a flag is set indicating that new registers need to be written to memory. A flag is set to indicate if the end of a packet has been reached.

FIG. 6 is a flowchart of an example method 600 for writing the registers to memory. The method 600 can be performed by the receiver circuit 120 of FIG. 1.

The method 600 includes determining whether new data is coming in (602), and if not, waiting for new data to arrive. The method 600 includes initializing variables to enable the ability to take data in (604). The method 600 includes determining whether a new set of registers is ready to be written to memory (606), and if not, waiting for registers to fill from bins.

The method 600 includes, if a new set of registers is ready to be written to memory, writing the contents of the registers into appropriate locations in memory segments for receiving the data (608). For example, the method 600 can include executing a for loop through Q loops as follows and as shown in FIG. 6:

```
For(Q = 0; Q < Qm; Q++)
{
    Write registers to
    Segment[Q][OffsetQ];
    Segment[Q][OffsetQ]++;
}
```

The method 600 includes determining if the end of the packet's data has been received (610). If not, the method 600 includes repeatedly waiting for new sets of registers and writing the registers until the end of the packet's data is received (return to 606). If so, the method 600 includes disabling the ability to take new data in (610), e.g., by setting an appropriate flag or parameter value to indicating that the writing process is complete.

FIG. 7 is a flowchart of an example method 700 for reading data out of memory and indicating which bits of the data bus are valid. The method 700 can be performed by the receiver circuit 120 of FIG. 1.

The method 700 includes determining whether the writing process (e.g., the method 600 of FIG. 6) is complete (702), and if not, waiting for the write process to complete. The method 700 includes, when the writing process is complete, initializing the appropriate parameters to begin reading (704). For example, a RdAddress parameter can be set to zero, an initial segment count can be set to zero, and an Init RdBitCount set to zero.

The method 700 includes reading data at a memory address indicated by an indexing variable, e.g., at memory [RdAddress], and incrementing RdAddress. The method 700 includes determining whether all of the valid bits have been read from that address (708), e.g., by determining whether a RdBitCount counter is greater than E/Q/B, and then increments RdBitCount if not (710). The method 700 repeats reading data until the valid bits have been read (return to 706).

The method 700 includes, when the valid bits have been read, setting the counter RdBitCnt to zero and incremented a segment counter (712). The method 700 includes putting the read data to output with lower bits of EdivQ indicating how many bits of the data bus are valid. The method 700 includes determining whether the read data corresponds to the last Q segment (714). If not, the method 700 includes continuing to read (return to 706).

Figure 8:
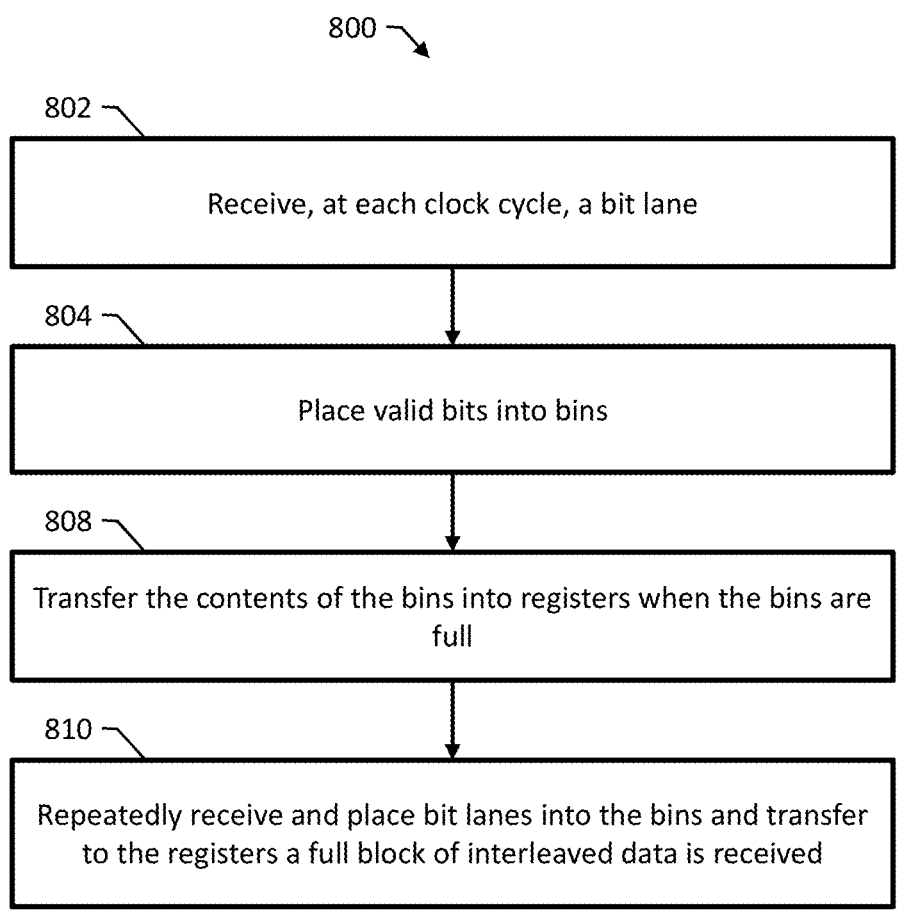
FIG. 8 is a flowchart of an example method for de-interleaving data in a communication system.

FIG. 8 is a flowchart of an example method 800 for de-interleaving data in a communication system. The method 800 can be performed by, e.g., the test system 102 of FIG. 1, where the method 800 can include emulating UEs and, for each UE, de-interleaving a received stream of packets for the UE. The method 800 can alternatively be performed by an individual UE or any other appropriate device for receiving an interleaved stream of data.

The method 800 includes receiving, at each clock cycle of a number of clock cycles of the communication system, a bit lane of data on a data bus, each bit lane including Q valid bits of an interleaved packet of length E (802). Receiving the bit lanes on the data bus can include receiving the bit lanes from a Physical Downlink Shared Channel (PDSCH) of a 5G system. Receiving the bit lanes on the data bus can include receiving the bit lanes from a gNodeB of the 5G system.

The method 800 includes placing, at each clock cycle, each of the Q valid bits into a respective bin of Q bins each having a bin width B (804).

The method 800 includes determining that the bins are full, and in response to determining that the bins are full, transferring contents of the bins into Q registers each having a register width B (806). Determining that the bins are full can include determining that each bin includes B valid bits of the interleaved packet.

The method 800 includes repeatedly receiving and placing data bits from the bit lanes into the bins and transferring the contents of the bins to the registers until E valid bits have been transferred to the registers (808).

The method 800 can include, after transferring the contents of the bins into the registers, storing the contents of the registers into Q segments of a memory area, each segment being sized to store E/Q bits. The memory area can be, e.g., an embedded memory area of an FPGA. The method 800 can include reading a de-interleaved packet from the Q segments of the memory area. Reading can include reading, at a first memory location, a number of stored bits and incrementing a counter for each bit read. Reading can include determining that the counter has reached a threshold count and, in response to determining that the counter has reached the threshold count, resetting the counter and reading additional stored bits at a second memory location.

It will be understood that various details of the presently disclosed subject matter may be changed without departing from the scope of the presently disclosed subject matter. Furthermore, the foregoing description is for the purpose of illustration only, and not for the purpose of limitation.

What is claimed is:

1. A method for de-interleaving data in a communication system, the method comprising:
   receiving, at each clock cycle of a plurality of clock cycles of the communication system, a bit lane of data on a data bus, each bit lane including Q valid bits of an interleaved packet of length E;
   placing, at each clock cycle, each of the Q valid bits into a respective bin of Q bins each having a bin width B;
   determining that the bins are full, and in response to determining that the bins are full, transferring contents of the bins into Q registers each having a register width B, and after transferring the contents of the bins into the registers, storing the contents of the registers into Q segments of a memory area, each segment being sized to store E/Q bits;
   reading a de-interleaved packet from the Q segments of the memory area, wherein reading the de-interleaved packet comprises reading, at a first memory location, a number of stored bits and incrementing a counter for each bit read; and
   repeatedly receiving and placing data bits from the bit lanes into the bins and transferring the contents of the bins to the registers until at least E valid bits have been transferred to the registers.

2. The method of claim 1, wherein determining that the bins are full includes determining that each bin includes B valid bits of the interleaved packet.

3. The method of claim 1, comprising determining that the counter has reached a threshold count and, in response to determining that the counter has reached the threshold count, resetting the counter and reading additional stored bits at a second memory location.

4. A method for de-interleaving data in a communication system, the method comprising:
   receiving, at each clock cycle of a plurality of clock cycles of the communication system, a bit lane of data on a data bus, each bit lane including Q valid bits of an interleaved packet of length E;
   placing, at each clock cycle, each of the Q valid bits into a respective bin of Q bins each having a bin width B;
   determining that the bins are full, and in response to determining that the bins are full, transferring contents of the bins into Q registers each having a register width B; and
   repeatedly receiving and placing data bits from the bit lanes into the bins and transferring the contents of the bins to the registers until at least E valid bits have been transferred to the registers;
   wherein receiving the bit lanes on the data bus comprises receiving the bit lanes from a Physical Downlink Shared Channel (PDSCH) of a 5G system.

5. The method of claim 4, wherein receiving the bit lanes on the data bus comprises receiving the bit lanes from a gNodeB of the 5G system.

6. The method of claim 4, comprising emulating a plurality of user equipment devices (UEs) and, for each UE, de-interleaving a received stream of PDSCH packets for the UE.

7. The method of claim 6, comprising generating a test report for the 5G system based on de-interleaving the received streams of packets for the UEs.

8. A system for de-interleaving data in a communication system, the system comprising:
a data bus;
Q registers each having a register width B; and
a receiver circuit configured for:
receiving, at each clock cycle of a plurality of clock cycles of the communication system, a bit lane of data on the data bus, each bit lane including Q valid bits of an interleaved packet of length E;
placing, at each clock cycle, each of the Q valid bits into a respective bin of Q bins each having a bin width equal to the register width B;
determining that the bins are full, and in response to determining that the bins are full, transferring contents of the bins into the registers, and after transferring the contents of the bins into the registers, storing the contents of the registers into Q segments of a memory area, each segment being sized to store E/Q bits;
reading a de-interleaved packet from the Q segments of the memory area, wherein reading the de-interleaved packet comprises reading, at a first memory location, a number of stored bits and incrementing a counter for each bit read; and
repeatedly receiving and placing data bits from the bit lanes into the bins and transferring the contents of the bins to the registers until at least E valid bits have been transferred to the registers.

9. The system of claim 8, wherein determining that the bins are full includes determining that each bin includes B valid bits of the interleaved packet.

10. The system of claim 8, wherein the receiver circuit is configured for determining that the counter has reached a threshold count and, in response to determining that the counter has reached the threshold count, resetting the counter and reading additional stored bits at a second memory location.

11. A system for de-interleaving data in a communication system, the system comprising:
a data bus;
Q registers each having a register width B; and
a receiver circuit configured for:
receiving, at each clock cycle of a plurality of clock cycles of the communication system, a bit lane of data on the data bus, each bit lane including Q valid bits of an interleaved packet of length E;
placing, at each clock cycle, each of the Q valid bits into a respective bin of Q bins each having a bin width equal to the register width B;
determining that the bins are full, and in response to determining that the bins are full, transferring contents of the bins into the registers; and
repeatedly receiving and placing data bits from the bit lanes into the bins and transferring the contents of the bins to the registers until at least E valid bits have been transferred to the registers;
wherein receiving the bit lanes on the data bus comprises receiving the bit lanes from a Physical Downlink Shared Channel (PDSCH) of a 5G system.

12. The system of claim 11, wherein receiving the bit lanes on the data bus comprises receiving the bit lanes from a gNodeB of the 5G system.

13. The system of claim 11, comprising a test controller configured for emulating a plurality of user equipment devices (UEs) and, for each UE, de-interleaving a received stream of PDSCH packets for the UE.

14. The system of claim 13, wherein the test controller is configured for generating a test report for the 5G system based on de-interleaving the received streams of packets for the UEs.

* * * * *